United States Patent
Park et al.

(10) Patent No.: US 10,276,638 B2
(45) Date of Patent: Apr. 30, 2019

(54) DATA DRIVER AND DISPLAY DEVICE USING THE SAME

(71) Applicant: LG Display Co., Ltd., Seoul (KR)

(72) Inventors: Joonmin Park, Seoul (KR); Sungjoon Bae, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/814,236

(22) Filed: Nov. 15, 2017

(65) Prior Publication Data

US 2018/0151636 A1 May 31, 2018

(30) Foreign Application Priority Data

Nov. 30, 2016 (KR) .................. 10-2016-0161663

(51) Int. Cl.
*G09G 3/325* (2016.01)
*H01L 27/32* (2006.01)
*G09G 3/3233* (2016.01)
*G09G 3/3283* (2016.01)
*G09G 3/3291* (2016.01)

(52) U.S. Cl.
CPC ......... *H01L 27/3218* (2013.01); *G09G 3/325* (2013.01); *G09G 3/3233* (2013.01); *G09G 3/3283* (2013.01); *G09G 3/3291* (2013.01); *H01L 27/3258* (2013.01); *H01L 27/3276* (2013.01); *G09G 2300/0426* (2013.01); *G09G 2300/0861* (2013.01);
(Continued)

(58) Field of Classification Search
CPC ............. H01L 27/3276; H01L 27/3272; H01L 27/3218; H01L 27/3258; G09G 3/3233; G09G 2300/0426; G09G 2300/0861; G09G 2320/0295; G09G 2320/0693; G09G 3/3283; G09G 3/3291; G09G 2310/0297; G09G 3/325
See application file for complete search history.

(56) References Cited

U.S. PATENT DOCUMENTS

2008/0007296 A1\* 1/2008 Umezaki .................. G09G 3/20
326/62
2014/0022289 A1 1/2014 Lee et al.
(Continued)

FOREIGN PATENT DOCUMENTS

KR 10-2016-0013446 A 2/2016

OTHER PUBLICATIONS

Taiwanese Office Action, Taiwanese Patent Application No. 106141015, dated Aug. 1, 2018, 7 pages.

*Primary Examiner* — Charles V Hicks
(74) *Attorney, Agent, or Firm* — Fenwick & West LLP

(57) ABSTRACT

A data driver and a display device using the same are disclosed. The display device includes a display panel having a display area displaying an image, signal lines including data lines, first power lines, and sensing lines connected to the display panel, and a data driver connected to the signal lines. The data driver includes first channel groups outputting a data signal, second channel groups outputting and sensing a sensing voltage, and third channel groups outputting a high potential voltage. The first channel groups and the third channel groups are defined as a first output unit, and the second channel groups are defined as a second output unit. The second channel groups are successively disposed every M channels, where M is an integer equal to or greater than 2.

14 Claims, 15 Drawing Sheets

(52) U.S. Cl.
CPC ............... *G09G 2310/0297* (2013.01); *G09G 2320/0295* (2013.01); *G09G 2320/0693* (2013.01); *H01L 27/3272* (2013.01)

(56) References Cited

U.S. PATENT DOCUMENTS

2014/0176622 A1   6/2014  Jung et al.
2015/0061981 A1   3/2015  Lee et al.
2016/0125800 A1   5/2016  Kim \* cited by examiner

DATA DRIVER AND DISPLAY DEVICE USING THE SAME

CROSS-REFERENCE TO RELATED APPLICATIONS

This application claims the benefit of Republic of Korea Patent Application No. 10-2016-0161663, filed on Nov. 30, 2016, which is incorporated herein in its entirety.

BACKGROUND

Field

The present disclosure relates to a data driver and a display device using the same.

Description of the Related Art

With the development of information technology, the market of display devices used as a connection medium between a user and information is growing. Thus, the use of display devices, such as an organic light emitting diode (OLED) display, a liquid crystal display (LCD), and a plasma display panel (PDP), is on the rise.

An OLED display includes a display panel including a plurality of subpixels and a driver for driving the display panel. The driver includes a scan driver for supplying a scan signal (or referred to as "gate signal") to the display panel, a data driver for supplying a data signal to the display panel, and the like.

When the scan signal and the data signal are supplied to the subpixels arranged in a matrix, the subpixels selected in response to the scan signal and the data signal emit light. Hence, the OLED display can display an image.

When the OLED display is used for a long time, the OLED display has a problem in that some of the components included in the subpixels experience a change in characteristics (for example, threshold voltage, current mobility, etc.). In order to compensate for the change in the characteristics, a method according to a related art has been proposed to add a sensing circuit for sensing characteristics of components included in subpixels. The method obtains a sensing value through sensing lines connected to the sensing circuit and compensates for characteristics of the components based on the sensing value.

However, with the addition of the sensing circuit, the sensing lines are disposed on the display panel in the same direction as data lines. At least three subpixels on the display panel share one sensing line with each other. As a result, one sensing line is disposed between the plurality of data lines.

Therefore, the related art method for adding the sensing circuit has a high probability that one sensing line is short-circuited with one of the data lines adjacent to the left and right sides of the one sensing line. If a short circuit occurs between the sensing line and the data line, all the subpixels sharing the short-circuited sensing line may be affected by the short circuit.

SUMMARY

In one aspect, there is provided a display device comprising a display panel having a display area displaying an image, signal lines including data lines, first power lines, and sensing lines connected to the display panel, and a data driver connected to the signal lines, the data driver including first channel groups outputting a data signal, second channel groups outputting and sensing a sensing voltage, and third channel groups outputting a high potential voltage, wherein the first channel groups and the third channel groups are defined as a first output unit, and the second channel groups are defined as a second output unit, and wherein the second channel groups are successively disposed every M channels, where M is an integer equal to or greater than 2.

In another aspect, there is provided a data driver comprising first channel groups configured to output a data signal, second channel groups configured to output and sense a sensing voltage, and third channel groups configured to output a high potential voltage, wherein the first channel groups and the third channel groups are defined as a first output unit, and the second channel groups are defined as a second output unit, and wherein the second channel groups are successively disposed every M channels, where M is an integer equal to or greater than 2.

BRIEF DESCRIPTION OF THE DRAWINGS

The accompany drawings, which are included to provide a further understanding of the invention and are incorporated on and constitute a part of this specification illustrate embodiments of the invention and together with the description serve to explain the principles of the invention.

DETAILED DESCRIPTION

Figure 1:
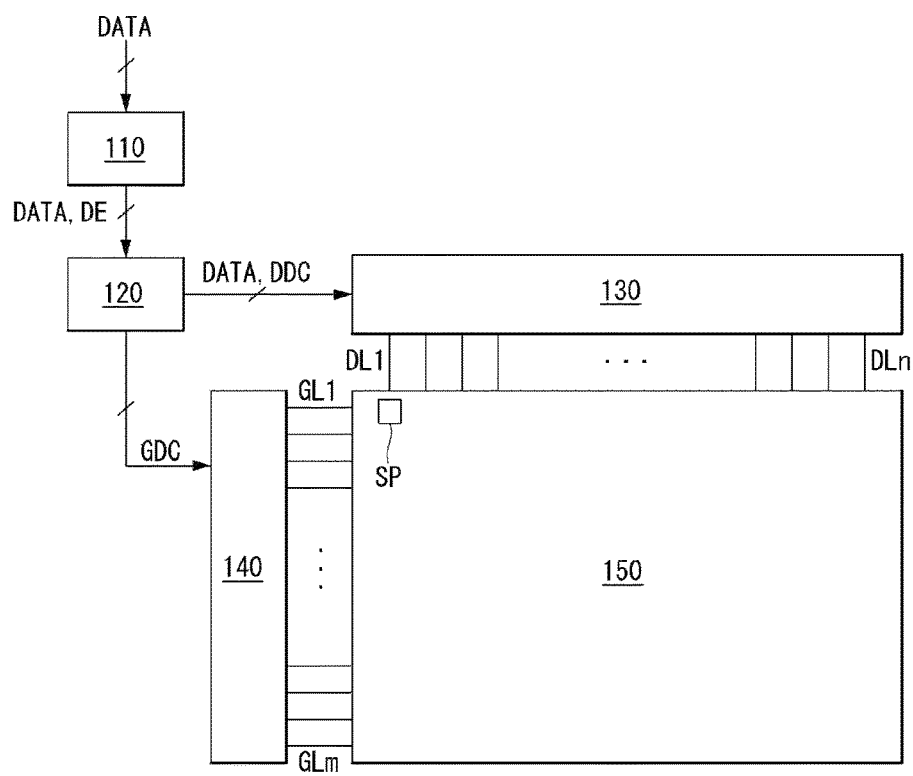
FIG. 1 is a schematic block diagram of an organic light emitting diode (OLED) display according to an embodiment of the disclosure.

Reference will now be made in detail to embodiments of the present disclosure, examples of which are illustrated in the accompanying drawings. Wherever convenient for explanation of the embodiments provided herein, the same reference numbers will be used throughout the drawings to refer to the same or like parts. In the present disclosure, a detailed description of known components or functionalities may be omitted if it is determined that a detailed description of such known components or functionalities may mislead or otherwise obscure the description of the embodiments of the present disclosure.

A display device according to embodiments may be implemented as a television system, a video player, a personal computer (PC), a home theater system, a smart phone, and the like. In the following description, a display device according to embodiments may be an organic light emitting diode (OLED) display implemented based on organic light emitting diodes (or light emitting elements), as an example. The OLED display according to embodiments performs an image display operation for displaying an image and an external compensation operation for compensating for changes in characteristics (or time-varying characteristics) of components over time.

The external compensation operation may be performed in a vertical blanking interval during the image display operation, in a power-on sequence interval before the beginning of the image display operation, or in a power-off sequence interval after the end of the image display operation. The vertical blanking interval is a period of time during which a data signal for image display is not applied, and is arranged between vertical active periods in which the data signal for one frame is applied.

The power-on sequence interval is a period of time between the turn-on of electric power for driving a display device and the beginning of an image display period, during which images are displayed on the display device. The power-off sequence interval is a period of time between the end of an image display period and the turn-off of electric power for driving the device.

An external compensation method performing the external compensation operation may operate a driving transistor in a source follower manner and then sense a voltage (for example, a source voltage of the driving transistor) stored in a line capacitor of a sensing line, but is not limited thereto. The line capacitor means a specific capacitance existing on the sensing line.

In order to compensate for a variation in a threshold voltage of the driving transistor, the external compensation method senses a source voltage when a voltage of a source node of the driving transistor is saturated (i.e., when a current Ids of the driving transistor is zero). Further, in order to compensate for a variation in mobility of the driving transistor, the external compensation method senses the voltage of the source node in a linear state before the voltage of the source node of the driving transistor is saturated.

In the following description, electrodes of a thin film transistor except a gate electrode may be referred to as a source electrode and a drain electrode, or a drain electrode and a source electrode, depending on types of thin film transistors. In addition, in the following description, a source electrode and a drain electrode, or a drain electrode and a source electrode, of the thin film transistor may be referred to as a first electrode and a second electrode.

Figure 2:
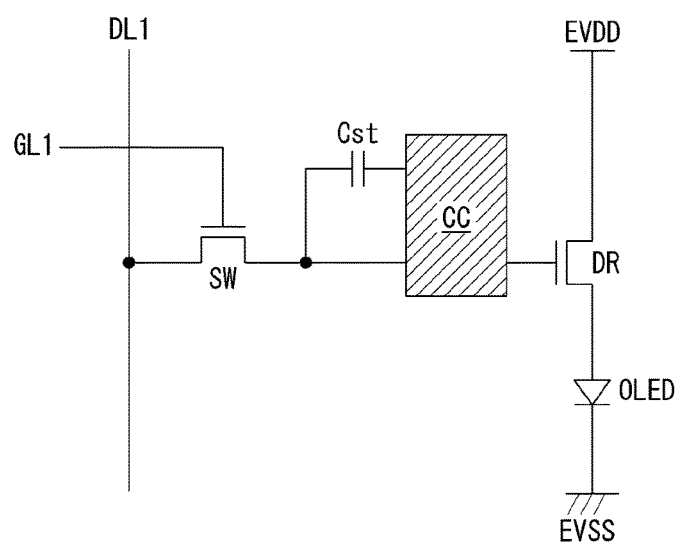
FIG. 2 schematically illustrates a circuit configuration of a subpixel according to an embodiment of the disclosure.
Figure 3:
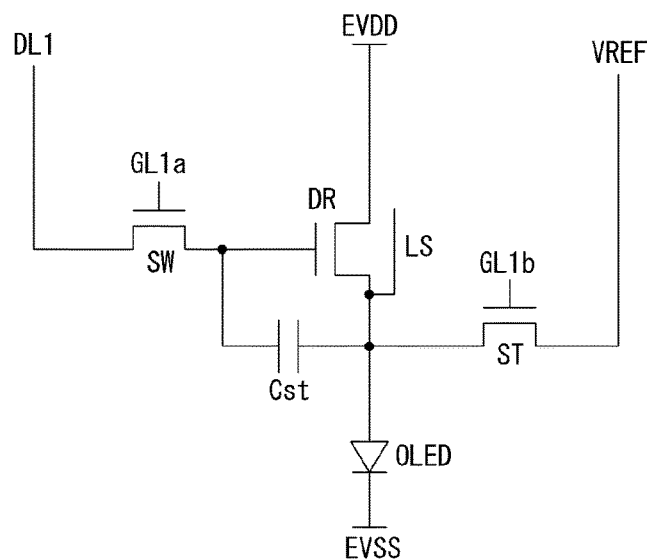
FIG. 3 illustrates in detail a circuit configuration of a subpixel according to an embodiment of the disclosure.
Figure 4:
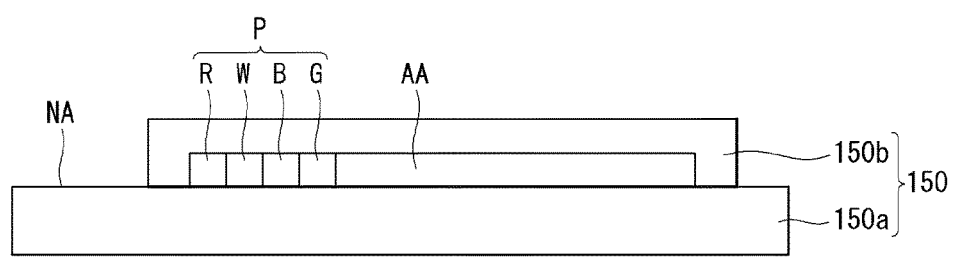
FIG. 4 is an exemplary cross-sectional view of a display panel according to an embodiment of the disclosure.
Figure 5:
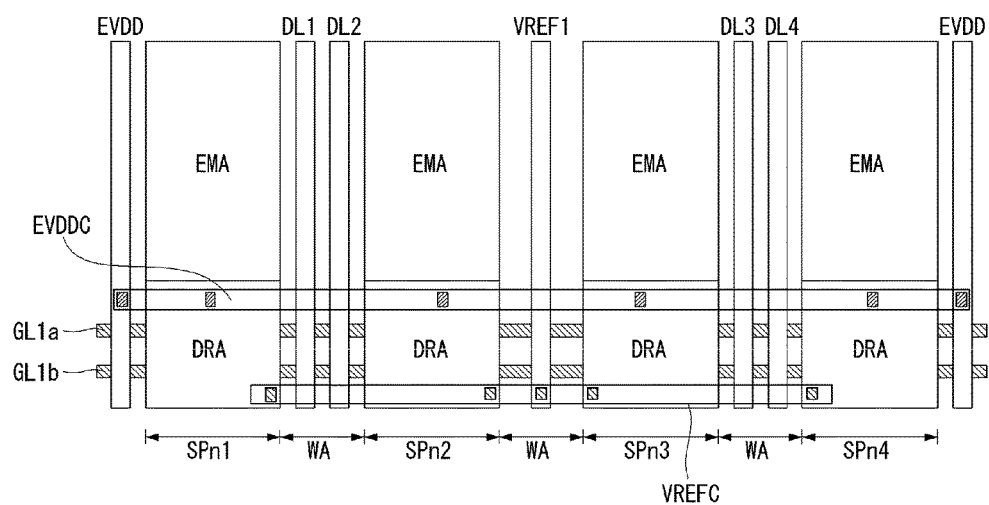
FIG. 5 schematically illustrates a planar layout of subpixels according to an embodiment of the disclosure.

FIG. 1 is a schematic block diagram of an OLED display. FIG. 2 schematically illustrates a circuit configuration of a subpixel. FIG. 3 illustrates in detail a circuit configuration of a subpixel. FIG. 4 is an exemplary cross-sectional view of a display panel. FIG. 5 schematically illustrates a planar layout of subpixels.

As shown in FIG. 1, an OLED display according to an embodiment includes an image processing unit 110, a timing controller 120, a data driver 130, a scan driver 140, and a display panel 150.

The image processing unit 110 outputs a data signal DATA and a data enable signal DE supplied from outside of the display device. The image processing unit 110 may further output one or more of a vertical sync signal, a horizontal sync signal, and a clock signal in addition to the data signal DATA and data enable signal DE. For the sake of brevity and ease of reading, these signals are not shown.

The timing controller 120 receives the data signal DATA and the data enable signal DE, and may further receive driving signals including the vertical sync signal, the horizontal sync signal, the clock signal, etc., from the image processing unit 110. The timing controller 120 outputs a gate timing control signal GDC for controlling operation timing of the scan driver 140 and a data timing control signal DDC for controlling operation timing of the data driver 130 based on the driving signals.

The data driver 130 samples and latches the data signal DATA received from the timing controller 120 in response to the data timing control signal DDC supplied from the timing controller 120 and converts the sampled and latched data signal DATA using gamma reference voltages. The data driver 130 outputs the converted data signal DATA to data lines DL1 to DLn. The data driver 130 may be formed as an integrated circuit (IC).

The scan driver 140 outputs a scan signal in response to the gate timing control signal GDC supplied from the timing controller 120. The scan driver 140 outputs the scan signal to scan lines GL1 to GLm. The scan driver 140 is formed as an IC or is formed on the display panel 150 in a gate-in-panel (GIP) manner.

The display panel 150 displays an image in response to the data signal DATA and the scan signal respectively received from the data driver 130 and the scan driver 140. The display panel 150 includes subpixels SP configured to display an image.

The subpixels SP may include red, green, and blue subpixels, or may include white, red, green, and blue subpixels. The subpixels SP may have one or more different emission areas depending on emission characteristics.

As shown in FIG. 2, each subpixel may include a switching transistor SW, a driving transistor DR, a capacitor Cst, a compensation circuit CC, and an organic light emitting diode OLED.

The switching transistor SW performs a switching operation so that a data signal supplied through a first data line DL1 is stored in the capacitor Cst as a data voltage in response to a scan signal supplied through a first scan line GL. The driving transistor DR enables a driving current to flow between a first power line (or referred to as "high potential power line") EVDD and a second power line (or referred to as "low potential power line") EVSS based on the data voltage stored in the capacitor Cst. The organic light emitting diode OLED emits light depending on the driving current provided by the driving transistor DR.

The compensation circuit CC is a circuit that is added to the subpixel and compensates for a characteristic, such as a threshold voltage, etc., of the driving transistor DR. The compensation circuit CC includes one or more transistors. Configuration of the compensation circuit CC may be variously changed in accordance with various embodiments, depending on an external compensation method and is described below with reference to FIG. 3.

As shown in FIG. 3, the compensation circuit CC may include a sensing transistor ST and a sensing line (or referred to as "reference line") VREF. The sensing transistor ST is connected between the sensing line VREF and a node (hereinafter referred to as "sensing node") that is electrically coupled to a source electrode of the driving transistor DR and to an anode electrode of the organic light emitting diode OLED. The sensing transistor ST may supply a sensing voltage (or referred to as "initialization voltage or reference voltage") transmitted through the sensing line VREF to the sensing node of the driving transistor DR, or may sense a voltage or a current (i.e., a voltage or a current present in the line capacitor) of the sensing node of the driving transistor DR or a voltage or a current (i.e., a voltage or a current present in the line capacitor) of the sensing line VREF.

A first electrode of the switching transistor SW is connected to the first data line DL1, and a second electrode of the switching transistor SW is connected to a gate electrode of the driving transistor DR A first electrode of the driving transistor DR is connected to the first power line EVDD, and a second electrode of the driving transistor DR is connected to the anode electrode of the organic light emitting diode OLED. A first electrode of the capacitor Cst is connected to the gate electrode of the driving transistor DR, and a second electrode of the capacitor Cst is connected to the anode electrode of the organic light emitting diode OLED. The anode electrode of the organic light emitting diode OLED is connected to the second electrode of the driving transistor DR, and a cathode electrode of the organic light emitting diode OLED is connected to the second power line EVSS. A first electrode of the sensing transistor ST is connected to the sensing line VREF, and a second first electrode of the sensing transistor ST is connected to the sensing node, i.e., the anode electrode of the organic light emitting diode OLED and the second electrode of the driving transistor DR.

An operation time of the sensing transistor ST may be similar to (or the same as) or different from an operation time of the switching transistor SW depending on an external compensation algorithm (or depending on a configuration of the compensation circuit). For example, a gate electrode of the switching transistor SW may be connected to a 1a scan line GL1a, and a gate electrode of the sensing transistor ST may be connected to a 1b scan line GL1b. In this instance, a scan signal (Scan) may be transmitted to the 1a scan line GL1a, and a sensing signal (Sense) may be transmitted to the 1b scan line GL1b. As another example, the gate electrode of the switching transistor SW and the gate electrode of the sensing transistor ST may share the 1a scan line GL1a or the 1b scan line GL1b and thus the gate electrodes of the switching transistor SW and the sensing transistor ST may be connected.

The sensing line VREF may be connected to the data driver, e.g., the data driver 130 shown in FIG. 1. In this instance, the data driver may sense the sensing node of the subpixel, via the sensing line VREF, during a non-display period of a real-time image or N frame period and generate a result of the sensing, where N is an integer equal to or greater than 1. The switching transistor SW and the sensing transistor ST may be turned on at the same time. In such a case, a sensing operation using the sensing line VREF and a data output operation, for driving the organic light-emitting diode OLED based on the data signal output by the data driver, are separated (or distinguished) from each other in accordance with a time-division driving method of the data driver.

In addition, a compensation target according to the sensing result may be a digital data signal, an analog data signal, a gamma signal, or the like. The compensation circuit for generating a compensation signal (or a compensation voltage) based on the sensing result may be implemented inside the data driver, inside the timing controller, or as a separate circuit.

A light shielding layer LS may be disposed only below a channel region of the driving transistor DR. Alternatively, the light shielding layer LS may be disposed below the channel region of the driving transistor DR and below channel regions of the switching transistor SW and the sensing transistor ST. The light shielding layer LS may be simply used for shielding external light. In addition, the light shielding layer LS may be connected to another electrode or another line and used as an electrode constituting the capacitor, etc. Therefore, the light shielding layer LS may be provided as a multilayer element formed of metal (for example, a multilayer of two different metals), so as to have a light shielding characteristic.

FIG. 3 illustrates the subpixel having a 3T(Transistor)1C (Capacitor) configuration, including the switching transistor SW, the driving transistor DR, the capacitor Cst, the organic light emitting diode OLED, and the sensing transistor ST, by way of example. However, when the compensation circuit CC is added to the subpixel, the subpixel may have various configurations such as 3T2C, 4T2C, 5T1C, and 6T2C.

As shown in FIG. 4, subpixels are formed on a display area AA of a first substrate (or referred to as "thin film transistor substrate") 150a, and each subpixel may have the circuit structure illustrated in FIG. 3. The subpixels on the display area AA are sealed by a protective film (or referred to as "protective substrate") 150b. In FIG. 4, the reference "NA" denotes a non-display area of the display panel 150. The first substrate 150a may be formed of a rigid or semi-rigid material such as glass, or it may be formed of a flexible material.

The subpixels are arranged on a surface of the first substrate 150a, and may be horizontally or vertically arranged in order of red (R), white (W), blue (B), and green (G) subpixels on the display area AA, depending on an orientation of the first substrate 150a. The red (R), white (W), blue (B), and green (G) subpixels together form one pixel P. However, embodiments are not limited thereto. For example, the arrangement order of the subpixels may be variously changed depending on an emission material, an emission area, configuration (or structure) of the compensation circuit, and the like. Further, the red (R), blue (B), and green (G) subpixels may form one pixel P.

As shown in FIGS. 4 and 5, first to fourth subpixels SPn1 to SPn4 each having an emission area EMA and a circuit area DRA are formed on the display area AA of the first substrate 150a. An organic light emitting diode (or a light emitting element) is formed in the emission area EMA, and a circuit including a switching transistor, a sensing transistor, a driving transistor, etc., for driving the organic light emitting diode is formed in the circuit area DRA. The elements in the emission area EMA and the circuit area DRA are formed through a thin film deposition process and include a plurality of metal layers and a plurality of insulating layers.

In the first to fourth subpixels SPn1 to SPn4, the organic light emitting diode in the emission area EMA emits light according to an operation of the switching transistor and the driving transistor in the circuit area DRA. A line portion (or referred to as "line area") WA is provided in areas adjacent to sides of each of the first to fourth subpixels SPn1 to SPn4. That is, the line portion WA may be a composite area that includes all of the areas between respective subpixels. A first power line EVDD, a sensing line VREF1, and first to fourth data lines DL1 to DL4 are disposed in the line area WA. The first power line EVDD is connected to all the first to fourth subpixels SPn1 to SPn4 through a first power connection line EVDDC. The sensing line VREF1 is connected to all the first to fourth subpixels SPn1 to SPn4 through a sensing connection line VREFC.

For example, the first power line EVDD may be positioned on the left side of the first subpixel SPn1, the sensing line VREF1 may be positioned on the right side of the second subpixel SPn2, and the first and second data lines DL1 and DL2 may be positioned between the first subpixel SPn1 and the second subpixel SPn2. The sensing line VREF1 may be positioned on the left side of the third subpixel SPn3, the first power line EVDD may further be positioned on the right side of the fourth subpixel SPn4, and the third and fourth data lines DL3 and DL4 may be positioned between the third subpixel SPn3 and the fourth subpixel SPn4.

The first subpixel SPn1 may be electrically connected to the first power line EVDD on the left side of the first subpixel SPn1, the first data line DL1 on the right side of the first subpixel SPn1, and the sensing line VREF1 on the right side of the second subpixel SPn2. The second subpixel SPn2 may be electrically connected to the first power line EVDD on the left side of the first subpixel SPn1, the second data line DL2 on the left side of the second subpixel SPn2, and the sensing line VREF1 on the right side of the second subpixel SPn2.

The third subpixel SPn3 may be electrically connected to the sensing line VREF1 on the left side of the third subpixel SPn3, the third data line DL3 on the right side of third subpixel SPn3, and the first power line EVDD on the right side of the fourth subpixel SPn4. The fourth subpixel SPn4 may be electrically connected to the sensing line VREF1 on the left side of the third subpixel SPn3, the fourth data line DL4 on the left side of the fourth subpixel SPn4, and the first power line EVDD on the right side of the fourth subpixel SPn4.

The first to fourth subpixels SPn1 to SPn4 may be commonly connected to the sensing line VREF1 between the second subpixel SPn2 and the third subpixel SPn3. Namely, the first to fourth subpixels SPn1 to SPn4 may share the sensing line VREF1 with one another. However, embodiments are not limited thereto.

The lines such as the first power line EVDD and the sensing line VREF and electrodes constituting a thin film transistor are positioned on different layers, but are electrically connected to each other through contact holes (or via holes). The contact holes are formed through a dry or wet etching process to partially expose the electrode, the signal line, or the power line positioned on a lower part of the subpixel.

As described above, with the addition of a sensing circuit, the sensing lines VREF are disposed on the display panel 150 in the same direction as the data lines DL1 to DLn. At least three subpixels on the display panel 150 share one sensing line VREF with each other. As a result, one sensing line VREF is disposed between the plurality of data lines DL1 to DLn. However, a method for adding the sensing circuit has a high probability that one sensing line VREF is short-circuited with one of the data lines adjacent to the left and right sides of the one sensing line VREF.

Hereinafter, embodiments of the disclosure for discussing problems of a related art and solving the problems will be described.

Related Art

Figure 6:
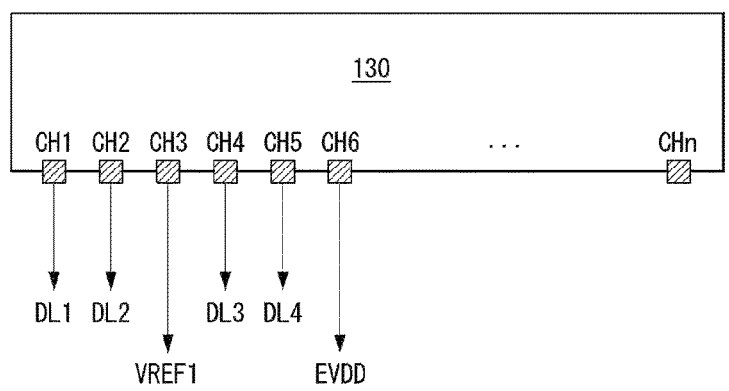
FIG. 6 illustrates output channels of a data driver according to a related art.
Figure 7:
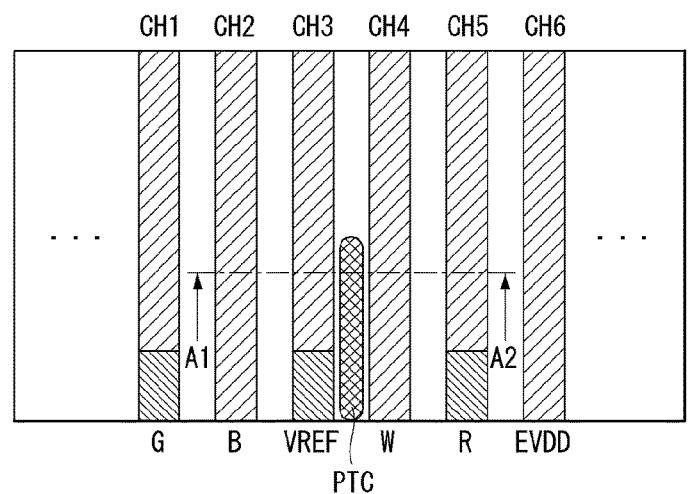
FIG. 7 illustrates signal lines of a pad portion of a display panel on which a data driver is mounted according to an embodiment of the disclosure.
Figure 8:
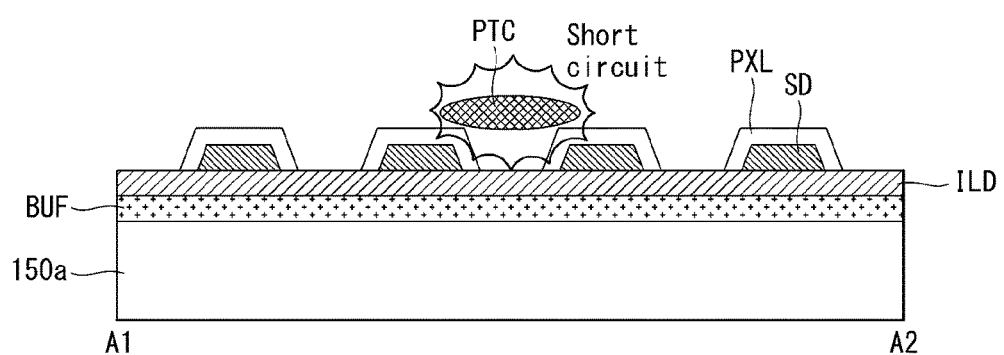
FIG. 8 is a cross-sectional view taken along line A1-A2 of FIG. 7 according to an embodiment of the disclosure.
Figure 9:
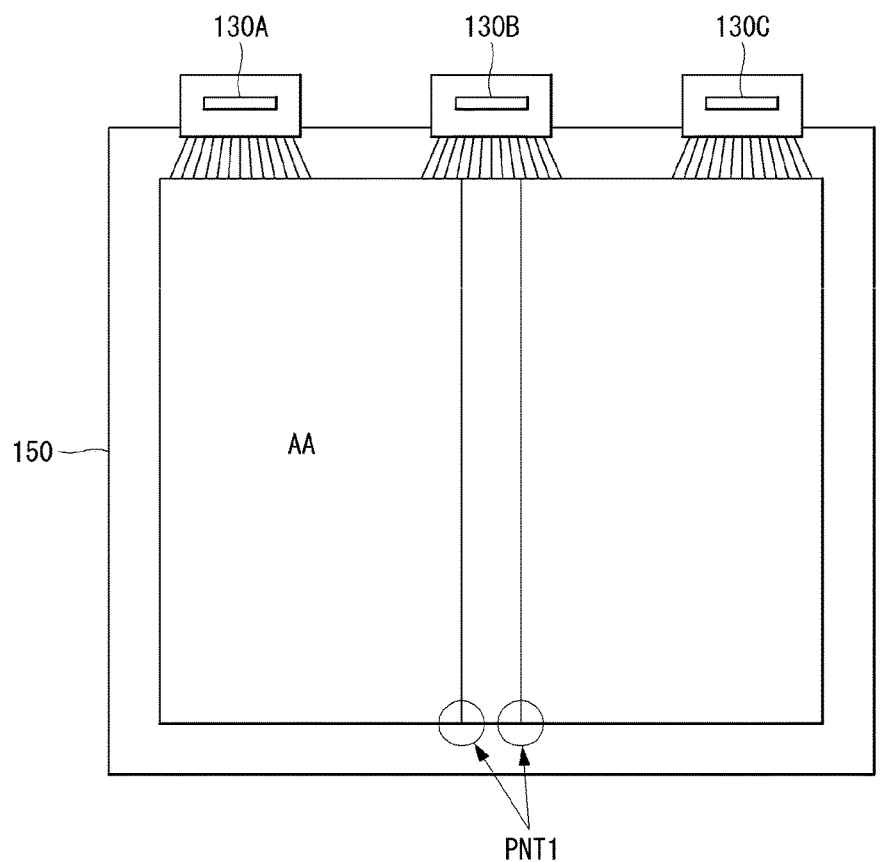
FIG. 9 illustrates problem of a structure according to a related art.

FIG. 6 illustrates output channels of a data driver according to a related art. FIG. 7 illustrates signal lines of a pad portion of a display panel on which a data driver is mounted. FIG. 8 is a cross-sectional view taken along line A1-A2 of FIG. 7. FIG. 9 illustrates problem of a structure according to a related art.

As shown in FIG. 6, a related art data driver 130 includes first channel groups CH1, CH2, CH4 and CH5 outputting data signals, second channel groups CH3 outputting and sensing a sensing voltage (for example, an initialization voltage or a reference voltage, etc.), and third channel groups CH6 outputting a high potential voltage. The first channel groups CH1, CH2, CH4 and CH5 are connected to data lines DL1 to DL4. The second channel groups CH3 are connected to a sensing line VREF, and the third channel groups CH6 are connected to a first power line EVDD.

The related art data driver 130 outputs the data signal and the high potential voltage for driving subpixels based on the first and third channel groups CH1, CH2, CH4, CH5 and CH6. The related art data driver 130 outputs the sensing voltage (for example, the initialization voltage or the reference voltage, etc.) for sensing the subpixels based on the second channel groups CH3 and also senses the output voltage (or current). FIG. 6 illustrates one second channel group CH3 for convenience of explanation. However, a plurality of second channel groups CH3 is provided.

In the related art data driver 130 including a plurality of channels CH1 to CHn that carry out different purposes as described above, the first to Nth channels CH1 to CHn are arranged in order of the first channel groups CH1, CH2, CH4 and CH5, the second channel groups CH3, and the third channel groups CH6. The arrangement takes into account links between the channel groups and signal lines (hereinafter, including the data lines, the first power lines, and sensing lines) on a display panel rather than input and output characteristics of the channel groups of the data driver 130.

Referring to FIG. 7 that shows a pad portion of the display panel, a sensing line VREF is disposed between data lines G, B, W and R, and a first power line EVDD is disposed outside the last data line R. Namely, various signal lines connected to the pad portion of the display panel are disposed according to the arrangement of the channels CH1 to CH6 of the data driver 130.

In FIG. 8, "BUF" is a buffer layer positioned on a first substrate 150a, and "ILD" is an insulating layer positioned above the buffer layer. In FIG. 7, the data lines are denoted by "G, B, W and R" in order to indicate that the data lines are respectively connected to green (G), blue (B), white (W) and red (R) subpixels in the order named. However, the subpixels may be arranged in other orders.

As shown in FIGS. 7 and 8, the data lines G, B, W and R, the sensing line VREF, and the first power line EVDD are made of a source drain metal layer SD and a first electrode layer PXL. Namely, the data lines G, B, W and R, the sensing line VREF, and the first power line EVDD are formed on the first substrate 150a using the same metal layer.

As described above, the related art is configured such that the data lines G, B, W and R and the sensing line VREF are formed using the same material through the same process, and one sensing line VREF is disposed between the data lines G, B, W and R. Thus, the related art has a high probability that the sensing line VREF is short-circuited with one of the data lines G, B, W and R adjacent to the left and right sides of the sensing line VREF.

Furthermore, the related art has a high probability that when a foreign material PTC enters the sensing line VREF in a process for manufacturing the display panel, a foreign short circuit may occur between the sensing line VREF and one of the data lines G, B, W and R adjacent to the left and right sides of the sensing line VREF.

FIGS. 7 and 8 illustrate the relatively large foreign material PTC, by way of example. However, even when the size of the foreign material PTC is relatively small, there is a high probability that a progressive short circuit occurs between two different kinds of signal lines adjacent to the foreign material PTC over time.

According to an experiment, as a range and an influence of the foreign short circuit between the sensing line VREF and the data lines G, B, W and R increased over time, the foreign short circuit tended to progress to the progressive short circuit. Further, according to the experiment, the short circuit between the sensing line VREF and the data lines G, B, W and R was generated much in the pad portion, to which the data driver is attached, or a link portion connecting the signal lines. The link portion is disposed in a non-display area outside a display area of the display panel.

When the short circuit occurs between the sensing line VREF and one of the data lines G, B, W and R, charges charged to a line capacitor of a subpixel, on which a sensing operation is performed, flow to the short-circuited data line, thereby obtaining an inaccurate sensing result (for example, a reduction in a sensing voltage).

As described above, when the short circuit occurs between two different kinds of signal lines, the short circuit affects not only a corresponding subpixel but also its surroundings. As a result, as indicated by a portion PNT1 of FIG. 9, a display defect such as a line defect of vertical lines appears in a display area AA of the display panel 150. In FIG. 9, "130A to 130C" denote data drivers mounted on a flexible substrate.

Accordingly, a related art method for adding a sensing circuit has a high probability that one sensing line VREF is short-circuited with one of the data lines G, B, W and R adjacent to the left and right sides of the one sensing line VREF. If a short circuit occurs between the two different kinds of signal lines, all the subpixels sharing the one sensing line VREF may be affected by the short circuit.

First Embodiment

Figure 10:
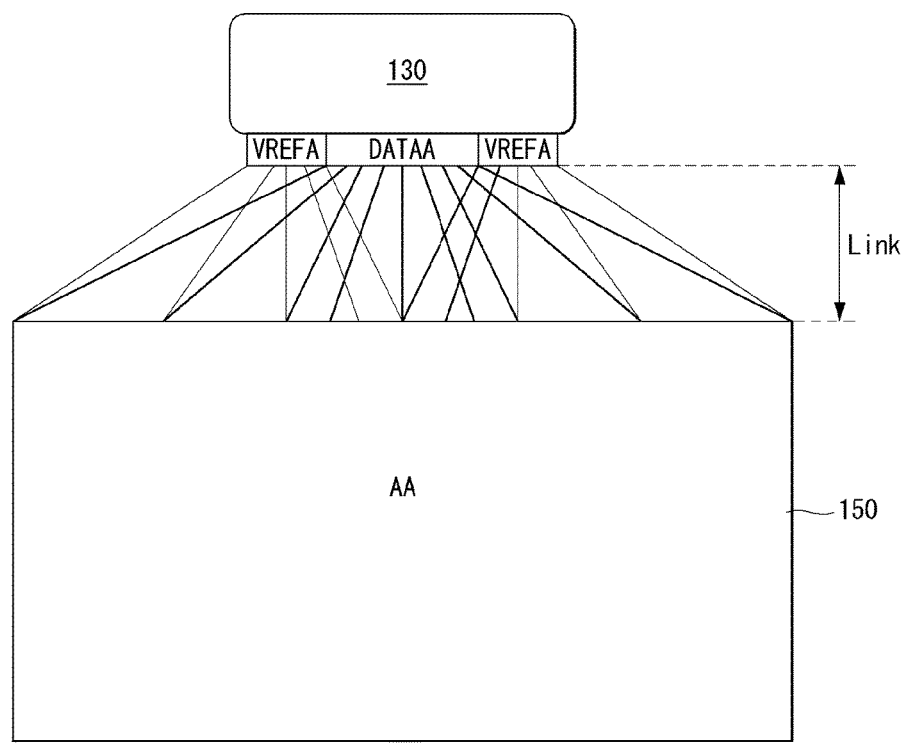
FIG. 10 illustrates an arrangement concept of output channels of a data driver according to a first embodiment of the disclosure.
Figure 11:
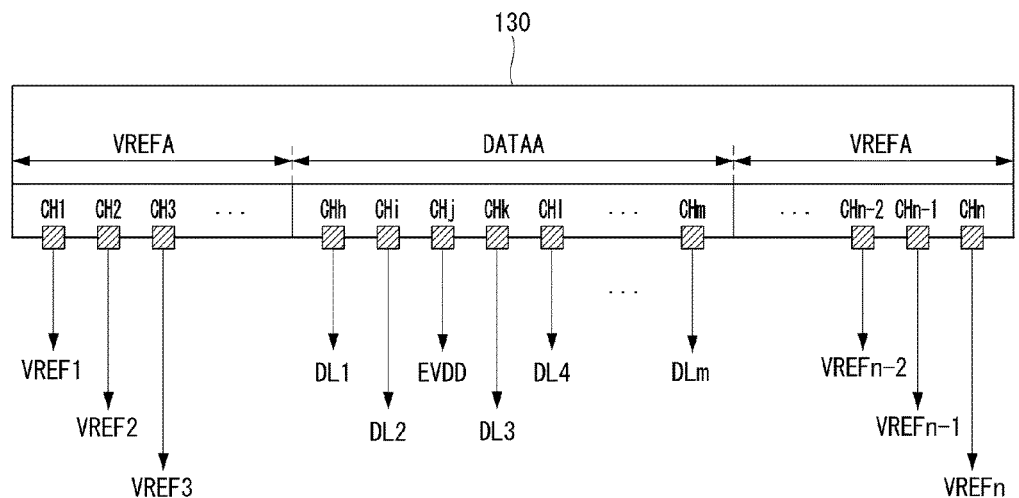
FIG. 11 illustrates in detail output channels of a data driver shown in FIG. 10 in accordance with the first embodiment of the disclosure.
Figure 12:
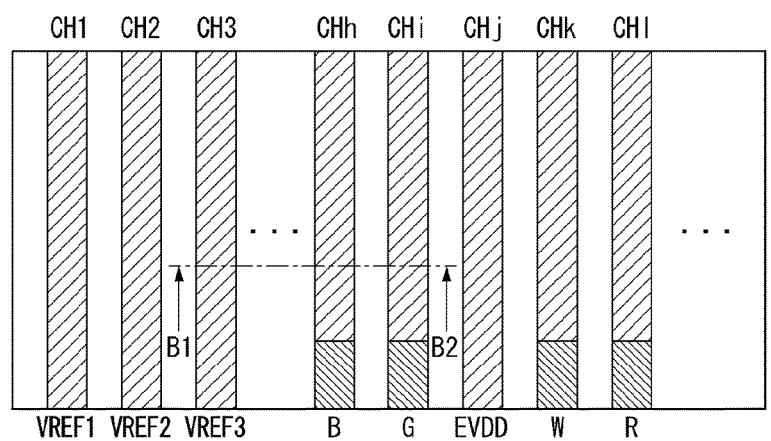
FIG. 12 illustrates signal lines of a pad portion of a display panel on which a data driver is mounted according to an embodiment of the disclosure.
Figure 13:
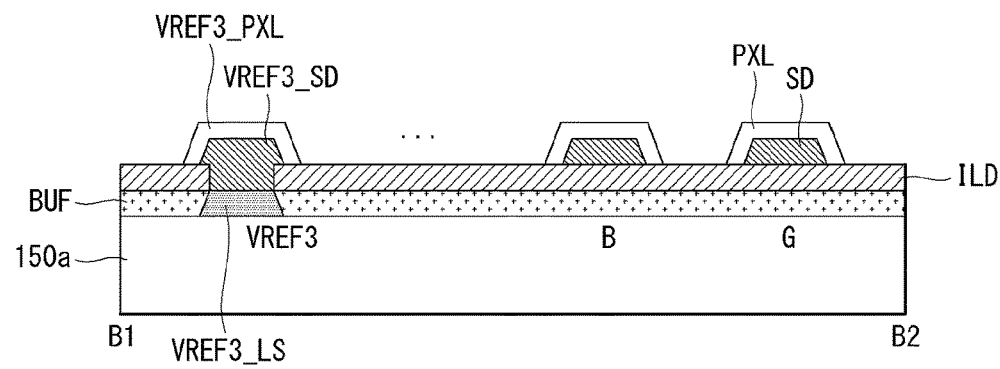
FIG. 13 is a cross-sectional view taken along line B1-B2 of FIG. 12 according to an embodiment of the disclosure.
Figure 14:
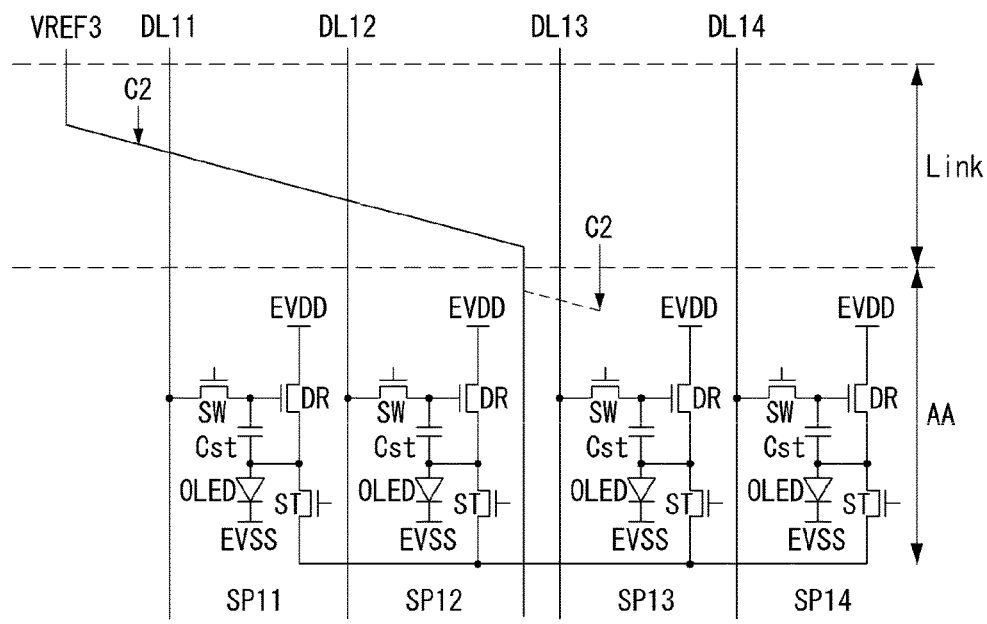
FIG. 14 illustrates signal lines around a link portion according to an embodiment of the disclosure.
Figure 15:
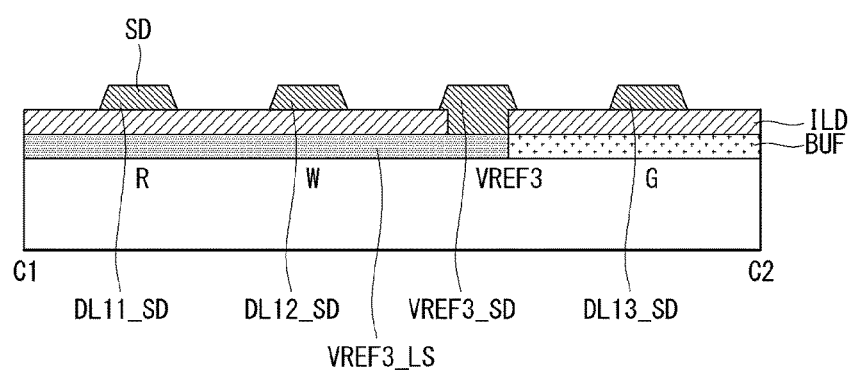
FIG. 15 is a cross-sectional view taken along line C1-C2 of FIG. 14 according to an embodiment of the disclosure.

FIG. 10 illustrates an arrangement concept of output channels of a data driver according to a first embodiment of the disclosure. FIG. 11 illustrates in detail output channels of a data driver shown in FIG. 10 in accordance with the first embodiment of the disclosure. FIG. 12 illustrates signal lines of a pad portion of a display panel on which a data driver is mounted. FIG. 13 is a cross-sectional view taken along line B1-B2 of FIG. 12. FIG. 14 illustrates signal lines around a link portion. FIG. 15 is a cross-sectional view taken along line C1-C2 of FIG. 14.

As shown in FIG. 10, a data driver 130 according to the first embodiment of the disclosure includes a first output unit DATAA having first channel groups outputting data signals and third channel groups outputting a high potential voltage, and second output units VREFA having second channel groups outputting and sensing a sensing voltage (for example, an initialization voltage or a reference voltage, etc.).

As the output units DATAA and VREFA of the data driver 130 having the channel groups are configured as described above, an intersection area of signal lines is formed in a link portion "Link" so that the signal lines are connected to subpixels disposed in a display area AA of a display panel 150. The link portion "Link" is disposed in a non-display area outside the display area AA of the display panel 150. The link portion "Link" and the output units DATAA and VREFA are described in detail below.

As shown in FIG. 11, the data driver 130 according to the first embodiment of the disclosure includes the first output unit DATAA and the second output units VREFA disposed on the left and right sides of the first output unit DATAA. The second output units VREFA are disposed on the left and right sides of the first output unit DATAA, and the number of channels included in the second output unit VREFA is divided equally or unequally. The number of sensing lines required may vary depending on a sensing method of the subpixels or a design of the sensing lines. Further, one pixel may include not four subpixels but three subpixels, or only some of subpixels constituting one pixel may be selectively connected to the sensing line and compensated. Therefore, the number of sensing lines may vary. Further, the number of channels included in the second output unit VREFA may be divided unequally depending on the number of sensing lines.

The first output unit DATAA includes first channel groups CHh, CHi, CHk, CHl, . . . , CHm outputting the data signals and third channel groups CHj outputting the high potential voltage. The first channel groups CHh, CHi, CHk, CHl, . . . , CHm are connected to data lines DL1 to DL4, . . . , DLm. The third channel groups CHj are connected to a first power line EVDD. FIG. 11 illustrates one third channel group CHj for convenience of explanation. However, a plurality of third channel groups CHj is provided.

The second output unit VREFA includes second channel groups CH1, CH2, CH3, . . . , CHn outputting and sensing the sensing voltage (for example, the initialization voltage or the reference voltage, etc.). The second channel groups CH1, CH2, CH3, . . . , CHn are successively disposed every M channels so that they are connected to sensing lines VREF1 to VREF3, . . . , VREFn, where M is an integer equal to or greater than 2.

The data driver 130 according to the first embodiment of the disclosure outputs the data signal and the high potential voltage for driving the subpixels based on the first channel groups CHh, CHi, CHk, CHl, . . . , CHm and the third channel groups CHj of the first output unit DATAA. Further, the data driver 130 according to the first embodiment of the disclosure outputs the sensing voltage for sensing the subpixels based on the second channel groups CH1, CH2, CH3, . . . , CHn of the second output unit VREFA and senses the output voltage (or current).

In the data driver 130 according to the first embodiment of the disclosure including a plurality of channels CH1 to CHn that carry out different purposes as described above, the first to Nth channels CH1 to CHn are arranged in order of the second output unit VREFA, the first output unit DATAA, and the second output unit VREFA. The arrangement takes into account input and output characteristics of the channel groups of the data driver 130 rather than links between the channel groups and signal lines on a display panel.

Referring to FIG. 12 that shows a pad portion of the display panel, the sensing lines VREF1 to VREF3 and the data lines B, G, W and R are spaced apart from each other, and the first power line EVDD is disposed between the data lines B, G, W and R. Namely, various signal lines connected to the pad portion of the display panel are disposed according to the arrangement of the output units VREFA and DATAA of the data driver 130.

In FIG. 13, "BUF" is a buffer layer positioned on a first substrate 150a, and "ILD" is an insulating layer positioned above the buffer layer. In FIG. 12, the data lines are denoted by "B, G, W and R" in order to indicate that the data lines are respectively connected to blue (B), green (G), white (W) and red (R) subpixels in the order named. However, the subpixels may be arranged in other orders.

As shown in FIGS. 12 and 13, the data lines B, G, W and R are made of a source drain metal layer SD and a first electrode layer PXL. The third sensing line VREF3 is made of a light shielding layer VREF3_LS, a source drain metal layer VREF3_SD, and a first electrode layer VREF3_PXL. Namely, the third sensing line VREF3 and the data lines B, G, W and R are formed on the first substrate 150a based on the same metal layer. However, the third sensing line VREF3 further includes the light shielding layer VREF3_LS positioned at a lowermost layer of the first substrate 150a. Although not shown, the first power line EVDD is formed on the first substrate 150a based on the same metal layer as the data lines B, G, W and R.

As described above, the first embodiment of the disclosure is configured such that the data lines B, G, W and R and the sensing lines VREF1 to VREF3 are formed using the same material through the same process and are spaced apart from each other. Further, the first power line EVDD is disposed between the data lines B, G, W and R in the same manner as the related art. In the first embodiment of the disclosure, the sensing lines VREF1 to VREF3 are not disposed between the data lines B, G, W and R and are spaced apart from the data lines B, G, W and R. Thus, the first embodiment of the disclosure has a very low probability that a short circuit occurs between the two different kinds of signal lines.

Furthermore, the first embodiment of the disclosure has a low probability that even when a foreign material PTC enters the sensing lines VREF1 to VREF3 in a process for manufacturing the display panel, a foreign short circuit occurs between the two different kinds of signal lines (i.e., the sensing lines VREF1 to VREF3 and the data lines B, G, W and R) because the same kind of other sensing lines are disposed on the left and right sides of the sensing line.

According to an experiment, problem caused by a short circuit between the same kind of signal lines was relatively less serious than problem caused by a short circuit between different kinds of signal lines (for example, the sensing lines VREF1 to VREF3 and the data lines B, G, W and R). When the short circuit occurs between different kinds of signal lines, at least three or four subpixels are affected by the short circuit. However, when the short circuit occurs between the same kind of signal lines, only two subpixels are affected by the short circuit. In addition, when the short circuit occurs between different kinds of signal lines, a damage or an erroneous operation of a circuit is caused by a difference between input and output voltages. However, when the short circuit occurs between the same kind of signal lines, only a luminance change appears by a difference between voltages applied to the two short-circuited signal lines.

According to the first embodiment of the disclosure, even when the foreign short circuit is generated, the first embodiment can generate the foreign short circuit between not different kinds of signal lines but the same kind of signal lines, thereby alleviating the problem caused by the short circuit as compared to the related art. Further, the first embodiment of the disclosure has a very low probability that the short circuit occurs between the sensing lines VREF1 to VREF3 and the data lines B, G, W and R. Therefore, the first embodiment can solve problem of an inaccurate sensing result (for example, a reduction in a sensing voltage) caused when charges charged to a line capacitor of a subpixel, on which a sensing operation is performed, flow to the short-circuited data line According to the experiment, the short circuit between the sensing lines VREF1 to VREF3 and the data lines B, G, W and R was generated much in the pad portion, to which the data driver is attached, or the link portion connecting the signal lines. Hence, the first embodiment of the disclosure proposes the sensing lines VREF1 to VREF3 positioned in the link portion in the following hierarchical structure.

As shown in FIGS. 14 and 15, the third sensing line VREF3 is disposed on the right outside of eleventh to fourteenth data lines DL11 to DL14, but is commonly connected to eleventh to fourteenth subpixels SP11 to SP14. The third sensing line VREF3 is disposed between twelfth and thirteenth subpixels SP12 and SP13.

The third sensing line VREF3 is disposed between the twelfth and thirteenth data lines DL12 and DL13 and is extended to a lower portion of the display panel in a vertical direction. Therefore, the third sensing line VREF3 is disposed in an oblique direction (or a diagonal direction) in the link portion "Link", and an intersection between the third sensing line VREF3 and the twelfth and thirteenth data lines DL12 and DL13 is formed in the link portion "Link".

The third sensing line VREF3 is disposed in a straight direction in the display area AA. Namely, the third sensing line VREF3 has an oblique line area disposed in the oblique direction in the link portion "Link" of the non-display area, and has a straight line area disposed in the straight direction in a line portion of the display area AA.

As can be seen from FIG. 15, the third sensing line VREF3 includes the light shielding layer VREF3_LS present at the lowermost layer in the link portion "Link", but includes the light shielding layer VREF3_LS and the source drain metal layer VREF3_SD in the display area AA. On the other hand, the eleventh to fourteenth data lines DL11 to DL14 are disposed in the straight direction in the display area AA as well as the link portion "Link" and include only source drain metal layers DL11_SD to DL14_SD in the display area AA and the link portion "Link".

As described above, the first embodiment of the disclosure described that the third sensing line VREF3 includes the light shielding layer VREF3_LS except the source drain metal layer VREF3_SD in the link portion, by way of example. However, embodiments are not limited thereto.

Second Embodiment

Figure 16:
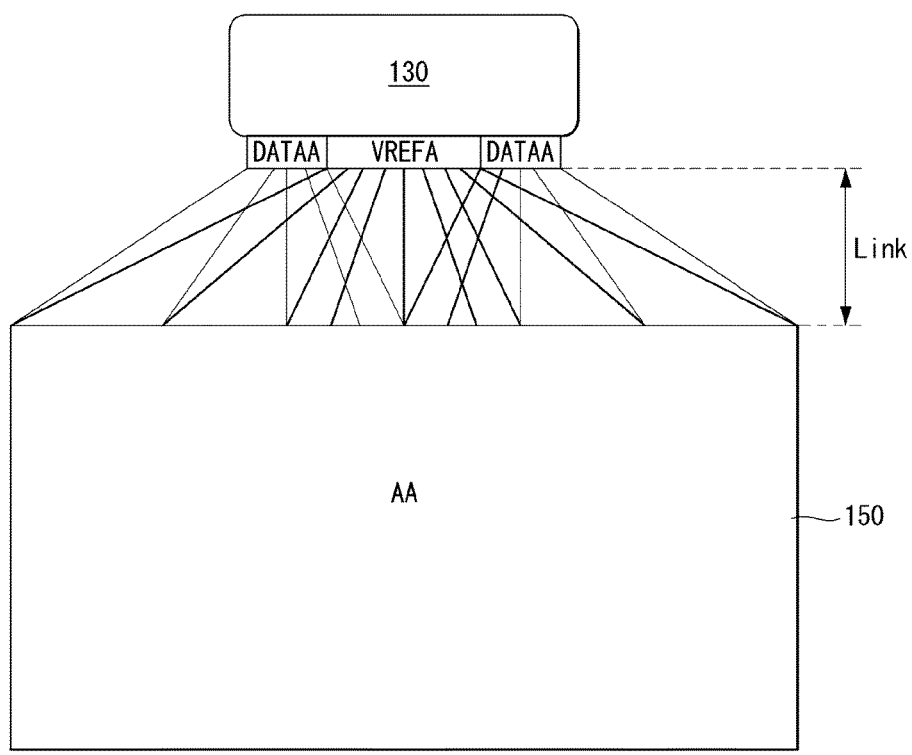
FIG. 16 illustrates an arrangement concept of output channels of a data driver according to a second embodiment of the disclosure.
Figure 17:
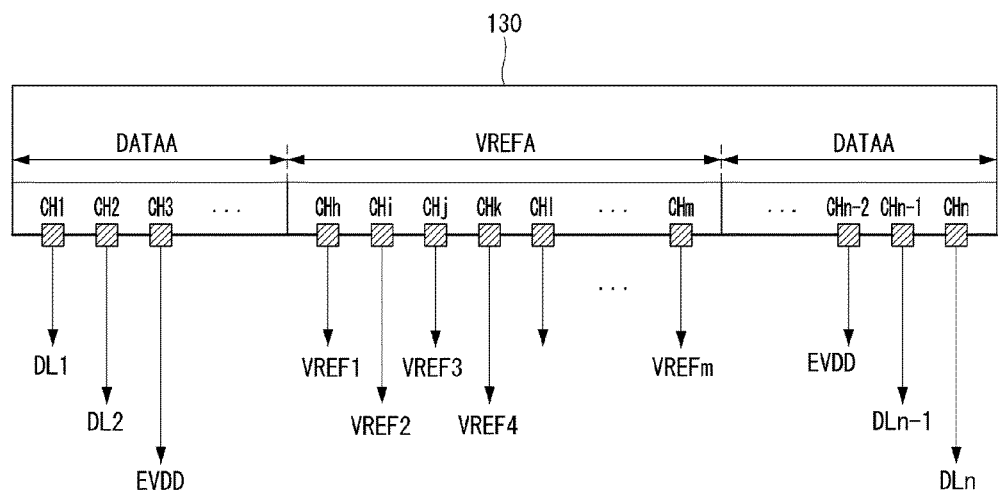
FIG. 17 illustrates in detail output channels of a data driver shown in FIG. 16 in accordance with the second embodiment of the disclosure.
Figure 18:
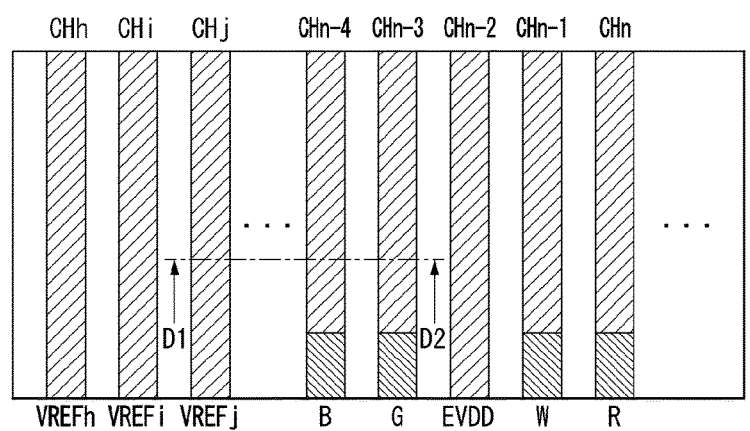
FIG. 18 illustrates signal lines of a pad portion of a display panel on which a data driver is mounted according to an embodiment of the disclosure.
Figure 19:
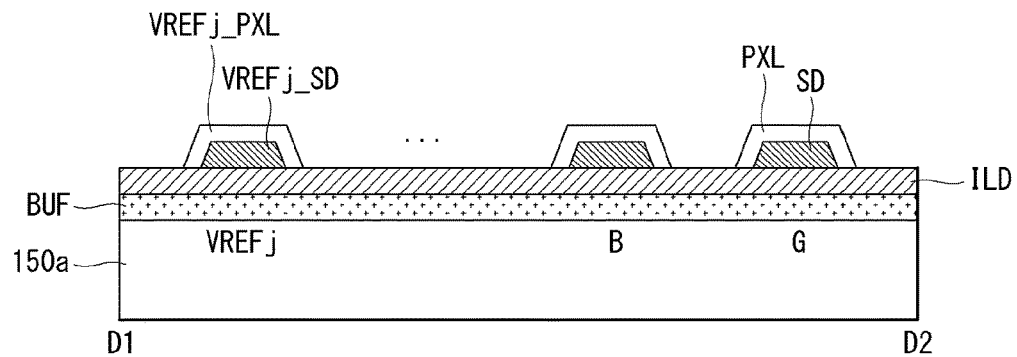
FIG. 19 is a cross-sectional view taken along line D1-D2 of FIG. 18 according to an embodiment of the disclosure.
Figure 20:
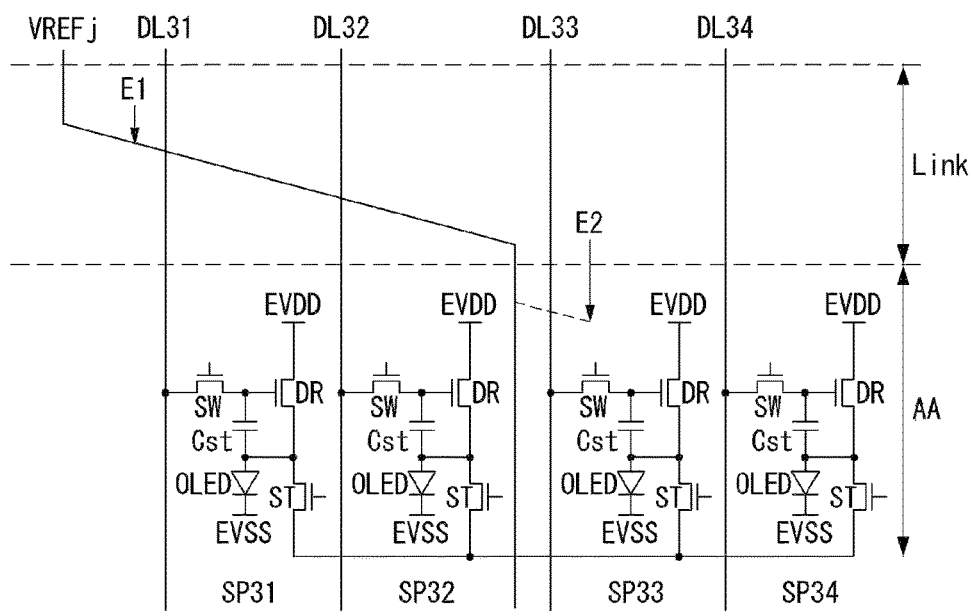
FIG. 20 illustrates signal lines around a link portion according to an embodiment of the disclosure.
Figure 21:
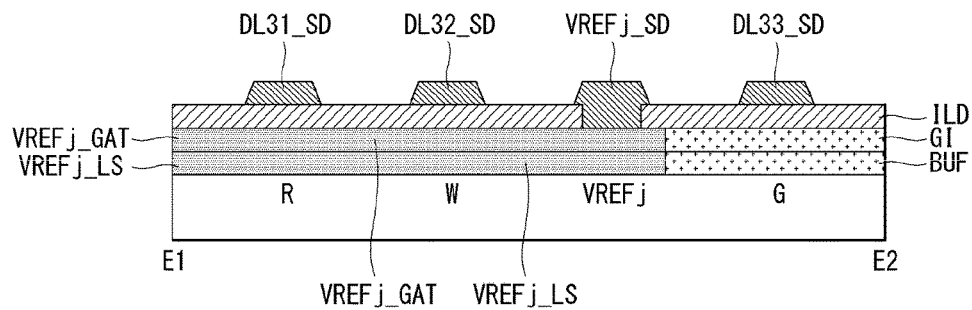
FIG. 21 is a cross-sectional view taken along line E1-E2 of FIG. 20 according to an embodiment of the disclosure.

FIG. 16 illustrates an arrangement concept of output channels of a data driver according to a second embodiment of the disclosure. FIG. 17 illustrates in detail output channels of a data driver shown in FIG. 16 in accordance with the second embodiment of the disclosure. FIG. 18 illustrates signal lines of a pad portion of a display panel on which a data driver is mounted. FIG. 19 is a cross-sectional view taken along line D1-D2 of FIG. 18. FIG. 20 illustrates signal lines around a link portion. FIG. 21 is a cross-sectional view taken along line E1-E2 of FIG. 20.

As shown in FIG. 16, a data driver 130 according to the second embodiment of the disclosure includes first output units DATAA having first channel groups outputting data signals and third channel groups outputting a high potential voltage, and a second output unit VREFA having second channel groups outputting and sensing a sensing voltage (for example, an initialization voltage or a reference voltage, etc.).

As the output units DATAA and VREFA of the data driver 130 having the channel groups are configured as described above, an intersection area of signal lines is formed in a link portion "Link" so that the signal lines are connected to subpixels disposed in a display area AA of a display panel 150. The link portion "Link" and the output units DATAA and VREFA are described in detail below.

As shown in FIG. 17, the data driver 130 according to the second embodiment of the disclosure includes the second output unit VREFA and the first output units DATAA disposed on the left and right sides of the second output unit VREFA. The first output units DATAA are disposed on the left and right sides of the second output unit VREFA, and the number of channels included in the first output unit DATAA is divided equally or unequally. The fact that the number of channels included in the first output unit DATAA is divided equally or unequally means that the number of channels included in the first output units DATAA may vary depending on an arrangement of the subpixels.

The first output unit DATAA includes first channel groups CH1, CH2, . . . , CHn outputting the data signals and third channel groups CH3, . . . , CHn-2 outputting the high potential voltage. The first channel groups CH1, CH2, . . . , CHn are connected to data lines DL1, DL2, . . . , DLn. The third channel groups CH3, . . . , CHn-2 are connected to a first power line EVDD. FIG. 17 illustrates two third channel groups for convenience of explanation. However, a plurality of third channel groups is provided.

The second output unit VREFA includes second channel groups CHh, CHi, CHj, CHk, . . . , CHm outputting and sensing the sensing voltage (for example, the initialization voltage or the reference voltage, etc.). The second channel groups CHh, CHi, CHj, CHk, . . . , CHm are successively disposed every M channels so that they are connected to sensing lines VREF1 to VREF4, . . . , VREFm, where M is an integer equal to or greater than 2.

The data driver 130 according to the second embodiment of the disclosure outputs the data signal and the high potential voltage for driving the subpixels based on the first channel groups CH1, CH2, . . . , CHn and the third channel groups CH3, . . . , CHn-2 of the first output unit DATAA. Further, the data driver 130 according to the second embodiment of the disclosure outputs the sensing voltage for sensing the subpixels based on the second channel groups CHh, CHi, CHj, CHk, . . . , CHm of the second output unit VREFA and senses the output voltage (or current).

In the data driver 130 according to the second embodiment of the disclosure including a plurality of channels CH1 to CHn that carry out different purposes as described above, the first to Nth channels CH1 to CHn are arranged in order of the first output unit DATAA, the second output unit VREFA, and the first output unit DATAA. The arrangement takes into account input and output characteristics of the channel groups of the data driver 130 rather than links between the channel groups and signal lines on a display panel.

Referring to FIG. 18 that shows a pad portion of the display panel, sensing lines VREFh to VREFj and data lines B, G, W and R are spaced apart from each other, and the first power line EVDD is disposed between the data lines B, G, W and R. Namely, various signal lines connected to the pad portion of the display panel are disposed according to the arrangement of the output units VREFA and DATAA of the data driver 130.

In FIG. 19, "BUF" is a buffer layer positioned on a first substrate 150a, and "ILD" is an insulating layer positioned above the buffer layer. In FIG. 19, the data lines are denoted by "B, G, W and R" in order to indicate that the data lines are respectively connected to blue (B), green (G), white (W) and red (R) subpixels in the order named. However, the subpixels may be arranged in other orders.

As shown in FIGS. 18 and 19, the data lines B, G, W and R are made of a source drain metal layer SD and a first electrode layer PXL. A jth sensing line VREFj is made of a light shielding layer VREFj_LS, a source drain metal layer VREFj_SD, and a first electrode layer VREFj_PXL. Namely, the jth sensing line VREFj and the data lines B, G, W and R are formed on the first substrate 150a based on the same metal layer. However, the jth sensing line VREFj further includes the light shielding layer VREFj_LS positioned at a lowermost layer. Although not shown, the first power line EVDD is formed on the first substrate 150a based on the same metal layer as the data lines B, G, W and R.

As described above, the second embodiment of the disclosure is configured such that the data lines B, G, W and R and the sensing lines VREFh to VREFj are formed using the same material through the same process and are spaced apart from each other. Further, the first power line EVDD is disposed between the data lines B, G, W and R in the same manner as the related art. In the second embodiment of the disclosure, the sensing lines VREFh to VREFj are not disposed between the data lines B, G, W and R and are spaced apart from the data lines B, G, W and R. Thus, the second embodiment of the disclosure has a very low probability that a short circuit occurs between the two different kinds of signal lines.

Furthermore, the second embodiment of the disclosure has a low probability that even when a foreign material PTC enters the sensing lines VREFh to VREFj in a process for manufacturing the display panel, a foreign short circuit occurs between the two different kinds of signal lines (i.e., the sensing lines VREFh to VREFj and the data lines B, G, W and R) because the same kind of other sensing lines are disposed on the left and right sides of the sensing line.

According to an experiment, problem caused by a short circuit between the same kind of signal lines was relatively less serious than problem caused by a short circuit between different kinds of signal lines (for example, the sensing lines VREFh to VREFj and the data lines B, G, W and R). When the short circuit occurs between different kinds of signal lines, at least three or four subpixels are affected by the short circuit. However, when the short circuit occurs between the same kind of signal lines, only two subpixels are affected by the short circuit. In addition, when the short circuit occurs between different kinds of signal lines, a damage or an erroneous operation of a circuit is caused by a difference between input and output voltages. However, when the short circuit occurs between the same kind of signal lines, only a luminance change appears by a difference between voltages applied to the two short-circuited signal lines.

According to the second embodiment of the disclosure, even when the foreign short circuit is generated, the second embodiment can generate the foreign short circuit between not different kinds of signal lines but the same kind of signal lines, thereby alleviating the problem caused by the short circuit as compared to the related art. Further, the second embodiment of the disclosure has a very low probability that the short circuit occurs between the sensing lines VREFh to VREFj and the data lines B, G, W and R. Therefore, the second embodiment can solve problem of an inaccurate sensing result (for example, a reduction in a sensing voltage) caused when charges charged to a line capacitor of a subpixel, on which a sensing operation is performed, flow to the short-circuited data line According to the experiment, the short circuit between the sensing lines VREFh to VREFj and the data lines B, G, W and R was generated much in the pad portion, to which the data driver is attached, or the link portion connecting the signal lines. Hence, the second embodiment of the disclosure proposes the sensing lines VREFh to VREFj positioned in the link portion in the following hierarchical structure.

In FIG. 21, "BUF" is a buffer layer positioned on a first substrate 150a, "GI" is a gate insulating layer positioned above the buffer layer, and "ILD" is an interlayer dielectric layer positioned above the gate insulating layer.

As shown in FIGS. 20 and 21, the jth sensing line VREFj is disposed on the right outside of 31th to 34th data lines DL31 to DL34, but is commonly connected to 31th to 34th subpixels SP31 to SP34. The jth sensing line VREFj is disposed between 32th and 33th subpixels SP32 and SP33.

The jth sensing line VREFj is disposed between the 32th and 33th data lines DL32 and DL33 and is extended to a lower portion of the display panel in a vertical direction. Therefore, the jth sensing line VREFj is disposed in an oblique direction (or a diagonal direction) in the link portion "Link", and an intersection between the jth sensing line VREFj and the 31th and 32th data lines DL31 and DL32 is formed in the link portion "Link".

The jth sensing line VREFj is disposed in a straight direction in the display area AA. Namely, the jth sensing line VREFj has an oblique line area disposed in the oblique direction in the link portion "Link" of the non-display area, and has a straight line area disposed in the straight direction in a line portion of the display area AA.

As can be seen from FIG. 21, the jth sensing line VREFj includes a light shielding layer VREFj_LS present at the lowermost layer and a gate metal layer VREFj_GAT on the light shielding layer VREFj_LS in the link portion "Link". On the other hand, the jth sensing line VREFj includes a source drain metal layer VREFj_SD on the gate metal layer VREFj_GAT in addition to the light shielding layer VREFj_LS and the gate metal layer VREFj_GAT in the display area AA. Further, the 31th to 34th data lines DL31 to DL34 are disposed in the straight direction in the display area AA as well as the link portion "Link" and include only source drain metal layers DL11_SD to DL14_SD in the display area AA and the link portion "Link".

As described above, the second embodiment of the disclosure described that the jth sensing line VREFj includes the light shielding layer VREFj_LS and the gate metal layer VREFj_GAT except the source drain metal layer VREFj_SD in the link portion, by way of example. However, embodiments are not limited thereto.

In addition, the output channels of the data driver may be configured in the following manners as well as the first and second embodiments, in order to reduce a probability of the short circuit between different kinds of signal lines.

Third Embodiment

Figure 22:
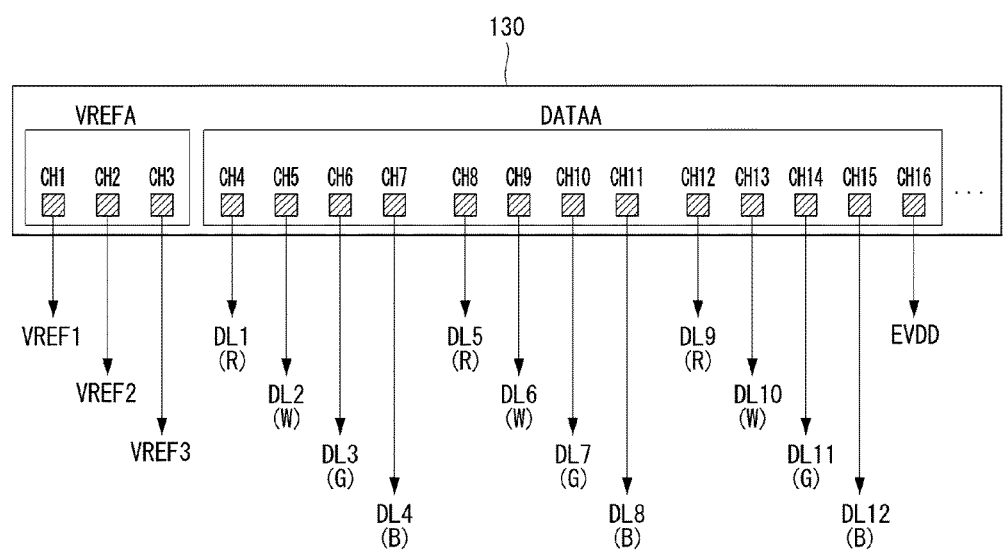
FIG. 22 illustrates output channels of a data driver according to a third embodiment of the disclosure.

FIG. 22 illustrates output channels of a data driver according to a third embodiment of the disclosure.

As shown in FIG. 22, a data driver 130 according to the third embodiment of the disclosure includes a second output unit VREFA and a first output unit DATAA that are disposed in the order named. Therefore, first to Nth channels CH1 to CHn of the data driver 130 according to the third embodiment of the disclosure are arranged in order of the second output unit VREFA, the first output unit DATAA, . . . , the second output unit VREFA, and the first output unit DATAA.

The second output unit VREFA includes second channel groups CH1 to CH3 outputting and sensing a sensing voltage (for example, an initialization voltage or a reference voltage, etc.). The second channel groups CH1 to CH3 are connected to sensing lines VREF1 to VREF3.

The first output unit DATAA includes first channel groups CH4 to CH15 outputting data signals and third channel groups CH16 outputting a high potential voltage. The first channel groups CH4 to CH15 are connected to data lines DL1 to DL12. The third channel groups CH16 are connected to a first power line EVDD. FIG. 22 illustrates one third channel group CH16 for convenience of explanation. However, a plurality of third channel groups CH16 is provided, and a position of the third channel groups CH16 is not limited thereto.

FIG. 22 illustrates the channel groups are arranged based on three unit pixels, each of which includes four subpixels R, W, G and B, by way of example. Thus, FIG. 22 illustrates the three second channel groups CH1 to CH3, the twelve first channel groups CH4 to CH15, and one third channel group CH16 as a minimum unit, by way of example. However, embodiments are not limited thereto.

Fourth Embodiment

Figure 23:
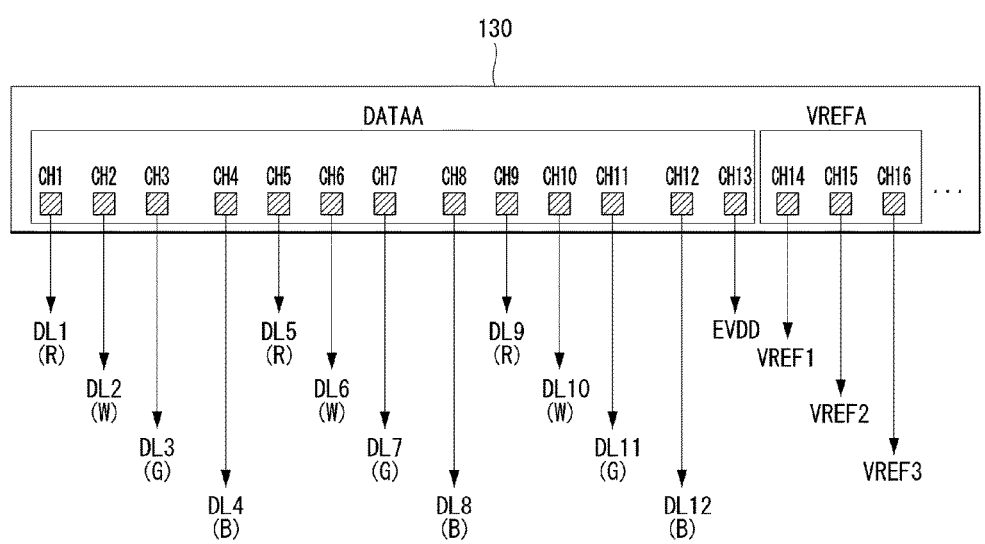
FIG. 23 illustrates output channels of a data driver according to a fourth embodiment of the disclosure.

FIG. 23 illustrates output channels of a data driver according to a fourth embodiment of the disclosure.

As shown in FIG. 23, a data driver 130 according to the fourth embodiment of the disclosure includes a first output unit DATAA and a second output unit VREFA that are disposed in the order named. Therefore, first to Nth channels CH1 to CHn of the data driver 130 according to the fourth embodiment of the disclosure are arranged in order of the first output unit DATAA, the second output unit VREFA, . . . , the first output unit DATAA, and the second output unit VREFA.

The first output unit DATAA includes first channel groups CH1 to CH12 outputting data signals and third channel groups CH13 outputting a high potential voltage. The first channel groups CH1 to CH12 are connected to data lines DL1 to DL12. The third channel groups CH13 are connected to a first power line EVDD. FIG. 23 illustrates one third channel group CH13 for convenience of explanation. However, a plurality of third channel groups CH13 is provided, and a position of the third channel groups CH13 is not limited thereto.

The second output unit VREFA includes second channel groups CH14 to CH16 outputting and sensing a sensing voltage (for example, an initialization voltage or a reference voltage, etc.). The second channel groups CH14 to CH16 are connected to sensing lines VREF1 to VREF3.

FIG. 23 illustrates the channel groups are arranged based on three unit pixels, each of which includes four subpixels R, W, G and B, by way of example. Thus, FIG. 23 illustrates the twelve first channel groups CH1 to CH12, one third channel group CH13, and the three second channel groups CH14 to CH16, as a minimum unit, by way of example. However, embodiments are not limited thereto.

As described above, the embodiments of the disclosure can reduce the probability of the short circuit (or the foreign short circuit) between the different kinds of signal lines, that may occur in the process for manufacturing the display panel, by changing the arrangement of the output channels of the data driver and changing a position (including the pad portion and the link portion) of the sensing line and the hierarchical structure of the sensing line. Hence, the embodiments of the disclosure can prevent or reduce the display defect of the display panel and increase the production yield and the reliability of the display device.

Although the embodiments have been described with reference to a number of illustrative embodiments thereof, numerous other modifications and embodiments may be devised by those skilled in the art that will fall within the scope of the principles of this disclosure. In particular, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a display panel having a display area displaying an image;
   signal lines including data lines, first power lines, and sensing lines connected to the display panel; and
   a data driver circuit connected to the signal lines, the data driver circuit including first channel groups that each includes a plurality of first channels that output data signals to the data lines, second channel groups that each includes a plurality of second channels that output and receive sensing voltages from the sensing lines, and third channel groups that each includes one or more third channels that each outputs a high potential voltage to the first power lines,
   wherein the first channel groups and the third channel groups are defined as a first output unit, and the second channel groups are defined as a second output unit, and
   wherein the plurality of second channels included in each of the second channel groups are disposed such that each second channel is adjacent to at least another second channel included in the second channel group.

2. The display device of claim 1, wherein the third channel groups are disposed between the second channel groups.

3. The display device of claim 1, wherein the second output unit is disposed on left and right sides of the first output unit.

4. The display device of claim 3, wherein the plurality of second channels included in the second output unit are divided in an unequal number on the left and right sides of the first output unit.

5. The display device of claim 1, wherein the sensing lines each have an oblique line area and a straight line area,
   wherein the oblique line area of each sensing line is disposed in an oblique direction in a link portion of a non-display area defined in the display panel, wherein the link portion is an area between the display panel and the data driver circuit where the signal lines intersect; and
   wherein the straight line area of each sensing line is disposed in a straight direction in a line portion of the display area of the display panel, the line portion between two adjacent pixels of the display panel.

6. The display device of claim 5, wherein the oblique line area of each of the sensing lines includes a light shielding layer positioned on a first substrate of the display panel, or includes the light shielding layer on the first substrate of the display panel and a gate metal layer on the light shielding layer.

7. The display device of claim 5, wherein the oblique line area of each of the sensing lines has an area intersecting some of the data lines.

8. The display device of claim 5, wherein for at least one of the sensing lines, the oblique line area of the sensing line overlaps a subset of the data lines where the data lines in the subset are consecutively disposed, and the straight line area of the sensing line is disposed parallel to the subset of the data lines, wherein the straight line area of the sensing line is between a last data line in the subset of the data lines and another data line subsequent to the last data line of the subset of the data lines.

9. The display device of claim 5, wherein the oblique line area of each of the sensing lines includes a light shielding layer positioned on a first substrate constituting the display panel, and
   wherein the straight line area of each of the sensing lines includes the light shielding layer and a source drain metal layer on the light shielding layer.

10. The display device of claim 5, wherein the oblique line area of each of the sensing lines includes a light shielding layer on a first substrate of the display panel and a gate metal layer on the light shielding layer, and
    wherein the straight line area of each of the sensing lines includes the light shielding layer, a gate metal layer on the light shielding layer, and a source drain metal layer on the gate metal layer.

11. A data driver circuit comprising:
    first channel groups that each includes a plurality of first channels that output data signals to data lines;
    second channel groups that each includes a plurality of second channels that output and receive sensing voltages from the sensing lines; and
    third channel groups that each includes one or more third channels that each outputs a high potential voltage to the first power lines,
    wherein the first channel groups and the third channel groups are defined as a first output unit, and the second channel groups are defined as a second output unit, and
    wherein the plurality of second channels included in each of the second channel groups are disposed such that each second channel is adjacent to at least another second channel included in the second channel group.

12. The data driver of claim 11, wherein the third channel groups are disposed between the second channel groups.

13. The data driver of claim 11, wherein the second output unit is disposed on left and right sides of the first output unit.

14. The data driver of claim 13, wherein the plurality of second channels included in the second output unit are divided in an unequal number on the left and right sides of the first output unit.

\* \* \* \* \*